United States Patent
Hsiao et al.

(10) Patent No.: US 12,260,549 B2
(45) Date of Patent: Mar. 25, 2025

(54) AUTOMATED DEEP CORRECTION OF MRI PHASE-ERROR

(71) Applicant: THE REGENTS OF THE UNIVERSITY OF CALIFORNIA, Oakland, CA (US)

(72) Inventors: Albert Hsiao, San Diego, CA (US); Evan Masutani, La Jolla, CA (US); Sophie You, La Jolla, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 397 days.

(21) Appl. No.: 17/672,613

(22) Filed: Feb. 15, 2022

(65) Prior Publication Data
US 2022/0261991 A1     Aug. 18, 2022

Related U.S. Application Data

(60) Provisional application No. 63/149,571, filed on Feb. 15, 2021.

(51) Int. Cl.
*G06T 7/00* (2017.01)
*G06N 3/08* (2023.01)
(Continued)

(52) U.S. Cl.
CPC ............. *G06T 7/0012* (2013.01); *G06N 3/08* (2013.01); *G06T 7/20* (2013.01); *G06V 10/82* (2022.01);
(Continued)

(58) Field of Classification Search
CPC ..... G06T 7/0012; G06T 7/20; G06T 2200/04; G06T 2207/10088; G06T 2207/20084;
(Continued)

(56) References Cited

U.S. PATENT DOCUMENTS 9,513,357 B2   12/2016  Hsiao et al.
10,398,344 B2   9/2019  Beckers et al.
(Continued)

OTHER PUBLICATIONS

Fathi et al. "Super-resolution and denoising of 4D-Flow MRI using physics-informed deep neural nets" published 2020 (Year: 2020).*
(Continued)

*Primary Examiner* — Ming Y Hon
(74) *Attorney, Agent, or Firm* — Eleanor Musick; Torrey Pines Law Group PC

(57) ABSTRACT

A method and system for automated correction of phase error in MRI-based flow evaluation employs a computer processor programmed to execute a trained convolutional neural network (CNN) to receive and process image data comprising flow velocity data in three directions and magnitude data collected from a region of interest over a scan period from magnetic resonance imaging instrumentation. The image data is processed using the trained CNN to generate three output channels with pixelwise inferred corrections for the flow velocity data which are further smoothed using a regression algorithm. The smoothed corrections are added to the original image data to generate corrected flow data, which may be used for flow visualization and quantization.

17 Claims, 11 Drawing Sheets
(10 of 11 Drawing Sheet(s) Filed in Color)

(51) Int. Cl.
  *G06T 7/20* (2017.01)
  *G06V 10/82* (2022.01)
(52) U.S. Cl.
  CPC .............. *G06T 2200/04* (2013.01); *G06T 2207/10088* (2013.01); *G06T 2207/20084* (2013.01); *G06T 2207/30104* (2013.01)
(58) Field of Classification Search
  CPC ............ G06T 2207/30104; G06N 3/08; G06V 10/82; G01R 33/5608
  See application file for complete search history.

(56) References Cited

U.S. PATENT DOCUMENTS

| | | | |
|---|---|---|---|
| 10,628,943 B2 | 4/2020 | Hsieh et al. | |
| 10,698,061 B2 | 6/2020 | Hsiao et al. | |
| 10,901,059 B1* | 1/2021 | Hu | G01R 33/5608 |
| 10,909,681 B2 | 2/2021 | Hsiao et al. | |
| 2007/0083112 A1* | 4/2007 | Dong | A61B 8/06 600/437 |
| 2012/0078084 A1 | 3/2012 | Piechnik et al. | |
| 2014/0112564 A1 | 4/2014 | Hsiao et al. | |
| 2016/0338613 A1* | 11/2016 | Beckers | A61B 5/021 |
| 2017/0045600 A1 | 2/2017 | Hsiao et al. | |
| 2017/0315203 A1* | 11/2017 | Knopp | G01R 33/5635 |
| 2018/0256042 A1* | 9/2018 | Beckers | A61B 5/7203 |
| 2018/0285699 A1 | 10/2018 | Kolouri et al. | |
| 2018/0333104 A1 | 11/2018 | Sitek | |
| 2019/0302211 A1* | 10/2019 | Cai | G06T 7/20 |
| 2020/0018809 A1* | 1/2020 | Duijndam | G01R 33/56518 |
| 2021/0169342 A1* | 6/2021 | Nordsletten | A61B 5/021 |
| 2022/0125314 A1* | 4/2022 | Meyer | G06T 7/143 |
| 2022/0151500 A1* | 5/2022 | Elbaz | G16H 50/50 |
| 2023/0091487 A1* | 3/2023 | Lee | G06T 5/77 382/128 |

OTHER PUBLICATIONS

Busch et al. "Image-Based Background Phase Error Correction in 4D Flow MRI Revisited" dated 2017 (Year: 2017).*
Akkus, Z., et al., Deep Learning for Brain MRI Segmentation: State of the Art and Future Directions, J Digital Imaging: 2017; pp. 449-459.
Azarine, A. et al., Four-dimensional Flow MRI: Principles and Cardiovascular Applications, Radiographics, 2019, pp. 632-648, vol. 39, No. 3.
Biglands, J.D., et al. Cardiovascular magnetic resonance physics for clinicians: part II; Journal of Cardiovascular Magnetic Resonance, 2012; 14:66; 40 pages.
Burt, J.R., et al., Myocardial T1 Mapping: Techniques and Potential Applications, RadioGraphics 2014; vol. 34 No. 2, pp. 377-395.
Chelu, Raluca G., et al., Qualitative grading of aortic regurgitation: a pilot study comparing CMR 4D flow and echocardiography, Int J Cardiovasc Imaging, 2016, pp. 301-307.
Girshick, R., et al., Fast R-CNN, Sep. 27, 2015, arXiv:1504.08083v2 [cs.CV] 9 pages.
Guan, Y., et al., Ensembles of Deep LSTM Learners for Activity Recognition using Wearables, Mar. 28, 2017, arXiv:1703.09370v1 [cs.LG] 28 pages.
Hasan, S.A., et al., Attention-based medical caption generation with image modality classification and clinical concept mapping, International Conference of the Cross-Language Evaluation Forum for European Languages, Springer, Cham, 2018.
Isin, A., et al., Review of MRI-based Brain Tumor Image Segmentation Using Deep Learning Methods; Procedia Computer Science, 2016, vol. 102, pp. 317-324.
Jellis, C.L., et al., Myocardial T1 mapping: modalities and clinical applications; Cardiovascular Diagnosis and Therapy 2014, vol. 4, pp. 126-137.
Karim, F., et al., LSTM Fully Convolutional Networks for Time Series Classification, IEEE Access; 2018; vol. 6., pp. 1662-1669.
Kather, J.N., et al., Color-coded visualization of magnetic resonance imaging multiparametric maps; Scientific Reports, Jan. 23, 2017, vol. 7, Art. No. 41107, 11 pages.
Kollias, D., et al., A Multi-component CNN-RNN Approach for Dimensional Emotion Recognition in-the-wild; May 3, 2018, arXiv:1805.01452v3 [cs.CV], 5 pages.
Krempl., G., et al., Workshop on Interactive Adaptive Learning (IAL), Proceedings of the European Conference on Machine Learning and Principles and Practice of Knowledge Discovery in Databases (ECML PKDD 2018); Sep. 10, 2018, Dublin, Ireland, 103 pages.
Lieman-Sifry, J., et al., FastVentricle: Cardiac Segmentation with ENet; Apr. 13, 2017; Pop M., Wright G. (eds) Functional Imaging and Modelling of the Heart, FIMH 2017, Lecture Notes in Computer Science, vol. 10263, Springer, Cham, 11 pages.
Liu, S., et al., Prostate Cancer Diagnosis Using Deep Learning with 3D Multiparametric MRI, Mar. 3, 2017, Proc. SPIE 10134, Medical Imaging 2017: Computer Aided Diagnosis, 1013428; 4 pages.
Minetto, R., et al., Hydra: an Ensemble of Convolutional NeuralNetworks for Geospatial Land Classification, Feb. 10, 2018, arXov:1802.03518 [cs.CV] 12 pages.
Padmanabhan, S., Convolutional Neural Networks for Image Classification and Captioning; spring 2016, downloaded at https://web.stanford.edu/class/cs231a/prev_projects_2016/example_paper.pdg; 8 pages.
Poudel, R.P.K., et al., Recurrent Fully Convolutional Neural Networks for Multi-Slice MRI Cardiac Segmentation, Aug. 13, 2016, arXiv:1608.03974v1 [stat.ML], 12 pages.
Prasoon, A., et al., Deep Feature Learning for Knee Cartilage Segmentation Using a Triplanar Convolutional Neural Network, MICCAI 2013, Part II, LNCS 8150, Springer-Verlag Berlin Heidelberg, Copenhagen, Denmark, 2013, pp. 246-253.
Retson, T., et al., Clinical Performance and Role of Expert Supervision of Deep Learning for Cardiac Ventricular Volumetry: A Validation Study, Radiology: Artificial Intelligence, pp. 1-9, vol. 2.
Ronneberger, O. et al., U-Net: Convolutional Networks for Biomedical Image Segmentation, May 18, 2015, pp. 1-8.
Schuhmacher, M., Autonomous anatomical structure recognition using machine learning. MS thesis. University of Twente, 2018.
Simonyan, K., et al., Very Deep Convolutional Networks for Large-Scale Image Recognition; Visual Geometry Group, Department of Engineering Science, University of Oxford, Sep. 2014; eprint arXiv:1409.1556.
Tran, P.V., A Fully Convolutional Neural Network for Cardiac Segmentation in Short-Axis, MRI, Apr. 27, 2017, arXiv:1604.00494v3 [cs.CV].
Wang, K., et al., Automated CT and MRI Liver Segmentation and Biometry Using a Generalized Convolutional Neural Network, Radiology: Artificial Intelligence, 2019, pp. 1-14, vol. 1.
Yasrab, R. Srnet: A Shallow Skip Connection Based Convolutional Neural Network Design for Resolving Singularities, Journal of Computer Science and Technology, Jul. 2019, pp. 924-938, vol. 34(4).

* cited by examiner

AUTOMATED DEEP CORRECTION OF MRI PHASE-ERROR

RELATED APPLICATIONS

This application claims the benefit of the priority of Provisional Application No. 63/149,571, filed Feb. 15, 2021, which is incorporated herein by reference in its entirety.

FIELD OF THE INVENTION

The present invention relates to a method for automatic correction of background magnetic phase-error in MRI images to facilitate flow evaluation including visualization and quantification.

BACKGROUND

Time-resolved 3D phase-contrast MRI with three-dimensional velocity encoding (4D Flow MRI) has become increasingly valuable for imaging of regional blood flow in the heart and great vessels for the evaluation of cardiovascular disease. 4D flow MRI provides unprecedented capabilities for comprehensive analysis of complex blood flow patterns using visualization tools such as streamlines and velocity vectors. Retrospective multiplanar navigation enables flexible retrospective flow quantification through any plane across the volume with good accuracy. Current flow parameters include forward flow, reverse flow, regurgitation fraction, and peak velocity. Four-dimensional flow MRI also supplies advanced flow parameters of use for research, such as wall shear stress. The vigorous burgeoning of new applications indicates that 4D flow MRI is becoming an important imaging modality for cardiovascular disorders.

The visual and quantitative assessment of abdominopelvic hemodynamics is essential in the evaluation of many clinical entities. In abdominal imaging, this is primarily undertaken with Doppler ultrasound (US) and time-resolved two-dimensional phase-contrast MRI. Abdominal US is limited by sonographic windows, but targeted windows can be applied to interrogate postoperative vascular complications of transplantation, renal artery stenosis, and other indications. Because of the need to place precise imaging planes at the time of the scan, planar phase-contrast MRI is challenging to implement in the clinical environment but can be used to evaluate mesenteric ischemia, aortic dissections, and other vascular conditions. Time-resolved three-dimensional (3D) phase-contrast MRI with three-directional velocity encoding (four-dimensional [4D] flow MRI) addresses these limitations by providing comprehensive imaging of the entire abdomen, allowing blood flow in any vessel to be retrospectively assessed in any direction.

While cardiothoracic and neurovascular applications of 4D flow MRI have grown rapidly, the correction of magnetic eddy current-related background phase error remains a challenge. Partial phase error correction can be achieved using pre-emphasis techniques, incorporation of gradient nonlinearity in the image reconstruction process, and field derivation and correction via Maxwell equations, however, residual phase error may compromise the accuracy of 4D flow measurements. Further phase error correction is therefore required. Current methods primarily address residual phase error through one of two approaches: stationary phantom imaging and polynomial regression of phase error in static soft tissues. Phantom-based correction methods require a second phantom scan after the patient scan with identical imaging parameters and are, therefore, impractical in a routine clinical setting. Image-based correction can use pixel-based velocity thresholding throughout the cardiac cycle but often requires a human operator for reliable segmentation of static soft tissues.

One strategy for addressing this problem involved the creation of software that allows users to select background soft tissue, then exercise a polynomial fit of background soft tissue to correct this phase error. This approach, detailed in U.S. Pat. No. 9,513,357 of Hsiao, et al., assigned to Stanford University, incorporated herein by reference, has been a mainstay of 4D flow phase error correction for the past decade.

A major issue that has remained problematic over the years is the need for training physicians and scientists to perform the semi-manual selection of background soft tissue to perform this phase error correction. One attempt at excluding this source of error in cardiothoracic 4D flow MRI used deep learning to automate selection and exclusion of the mediastinum. This approach, and partial solution, was incorporated into Arterys software in early 2019 and presented at the September 2019 meeting of the North American Society for Cardiovascular Imaging (NASCI). Azarine, et al., "Four-dimensional Flow MRI: Principles and Cardiovascular Applications", *RadioGraphics* 2019; 39:632-648, which in incorporated herein by reference for its disclosure of 4D flow MRI procedures.

The strategy of soft tissue selection or extraction is however problematic, as different territories of the body require manual exclusion of different sources of error. In the brain, the primary sources of error in phase error correction are the neurovascular structures (arteries and veins). In the chest, the primary sources are the heart and great vessels, including pulmonary arteries and veins. In the abdomen, the primary sources of error are the abdominal vasculature, including arteries, systemic veins and portal venous system. Thus, each region would require specific training of physicians, technicians or algorithms to identify the relevant structures in order to perform reliable correction. The need remains for a method for automatically correcting background magnetic phase error in MRI images, which is critical for measurement of blood flow by 4D flow MRI.

BRIEF SUMMARY

Convolutional neural networks (CNNs) are an emerging class of deep learning techniques that have been used for classification, localization, and segmentation and have broad potential to further benefit medical image analysis. According to the inventive approach, a deep learning algorithm is provided to generate phase error corrections without human intervention, simplifying the analysis and interpretation of abdominopelvic 4D flow acquisitions. The fully automated deep learning algorithm, configured to perform image-based background phase error correction in 4D flow MRI demonstrates comparable effectiveness relative to manual image-based correction, applying inflow-outflow consistency as a principal benchmark of algorithm performance.

According to embodiments of the inventive method, an automated deep learning-based approach employs a multichannel 3D convolutional neural network (CNN) to produce corrected velocity fields. Comparisons of arterial and venous flow, as well as flow before and after bifurcation of major abdominal vessels, show improved flow continuity with greater agreement after automated correction. Results of automated corrections are comparable to manual corrections.

In one aspect of the invention, a method for automated correction of phase error in MRI-based flow evaluation includes: receiving in a computer processor configured for executing a trained convolutional neural network (CNN) image data comprising flow velocity data in three directions and magnitude data collected from a region of interest over a scan period from magnetic resonance imaging instrumentation, wherein the region of interest includes static tissue and vessels; processing the image data with the trained CNN to generate three output channels comprising pixelwise inferred corrections for the flow velocity data; smoothing the pixelwise inferred corrections using a regression algorithm to generate smoothed corrections; and adding the smoothed corrections to the image data to generate corrected flow data, wherein the corrected flow data is used for flow visualization and quantization. The trained CNN is trained using manually corrected data obtained via manual segmentation of the static tissue followed by a patch-wise linear regression of static tissue velocities. In some embodiments, the trained CNN may be trained over several hundred epochs using mean squared error loss, hyperbolic tangent activation, and Adam optimization.

In some embodiments, the trained CNN is a multichannel three-dimensional U-Net. The regression algorithm may be least squares regression to a third-order polynomial.

The region of interest may be an abdominal region of a subject and the vessels are abdominal vasculature.

In another aspect of the invention a system for correction of phase error in MRI-based flow evaluation includes at least one computer processor configured to: acquire image data comprising flow velocity data in three directions and magnitude data collected from a region of interest over a scan period from magnetic resonance imaging instrumentation; execute a convolutional neural network (CNN), wherein the CNN is trained to generate three output channels comprising pixelwise inferred corrections for the flow velocity data; execute a smoothing algorithm on the pixelwise inferred corrections to generate smoothed corrections; and add the smoothed corrections to the image data to generate corrected flow data, wherein the corrected flow data is used for flow visualization and quantization. The trained CNN may be trained using manually corrected data obtained via manual segmentation of the static tissue followed by a patch-wise linear regression of static tissue velocities. In some embodiments, the trained CNN may be trained over several hundred epochs using mean squared error loss, hyperbolic tangent activation, and Adam optimization.

In some embodiments, the trained CNN is a multichannel three-dimensional U-Net. The regression algorithm may be least squares regression to a third-order polynomial.

The region of interest may be an abdominal region of a subject and the vessels are abdominal vasculature.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 10A shows agreement between manual and automated correction according to the inventive method; FIG. 10B a box-and-whisker plot grouped by vessel type comparing uncorrected, manually corrected, and automatically corrected flow differences among the five vessel comparisons; and FIG. 10C provides Bland-Altman plots comparing arterial and venous flow, showing flow consistency with uncorrected, manually corrected and automatically corrected results.

DETAILED DESCRIPTION OF EMBODIMENTS

An automated deep learning-based approach employs a multichannel 3D convolutional neural network (CNN) to produce corrected velocity fields. Comparisons of arterial and venous flow, as well as flow before and after bifurcation of major abdominal vessels, show improved flow continuity with greater agreement after automated correction. CNNs have the potential to automate background phase-error correction, improving the reliability of quantitative flow measurements in 4D Flow MRI and increasing its accessibility for abdominal vascular applications.

According to embodiments of the inventive approach, the CNN was a U-Net, a fully convolutional network that is known in the art, its name derived from its u-shaped architecture, as shown. (See, O. Ronneberger, et al., "U-Net: Convolutional Networks for Biomedical Image Segmentation", (2015) arXiv: 1505.04597 [cs.CV], incorporated herein by reference). Briefly, the U-Net employs repeated application of convolutions, each followed by an activation function and a max pooling operation. During the contraction, the spatial information is reduced while feature information is increased. The expansive pathway combines the feature and spatial information through a sequence of up-convolutions and concatenations with high-resolution features from the contracting path.

Figure 2:
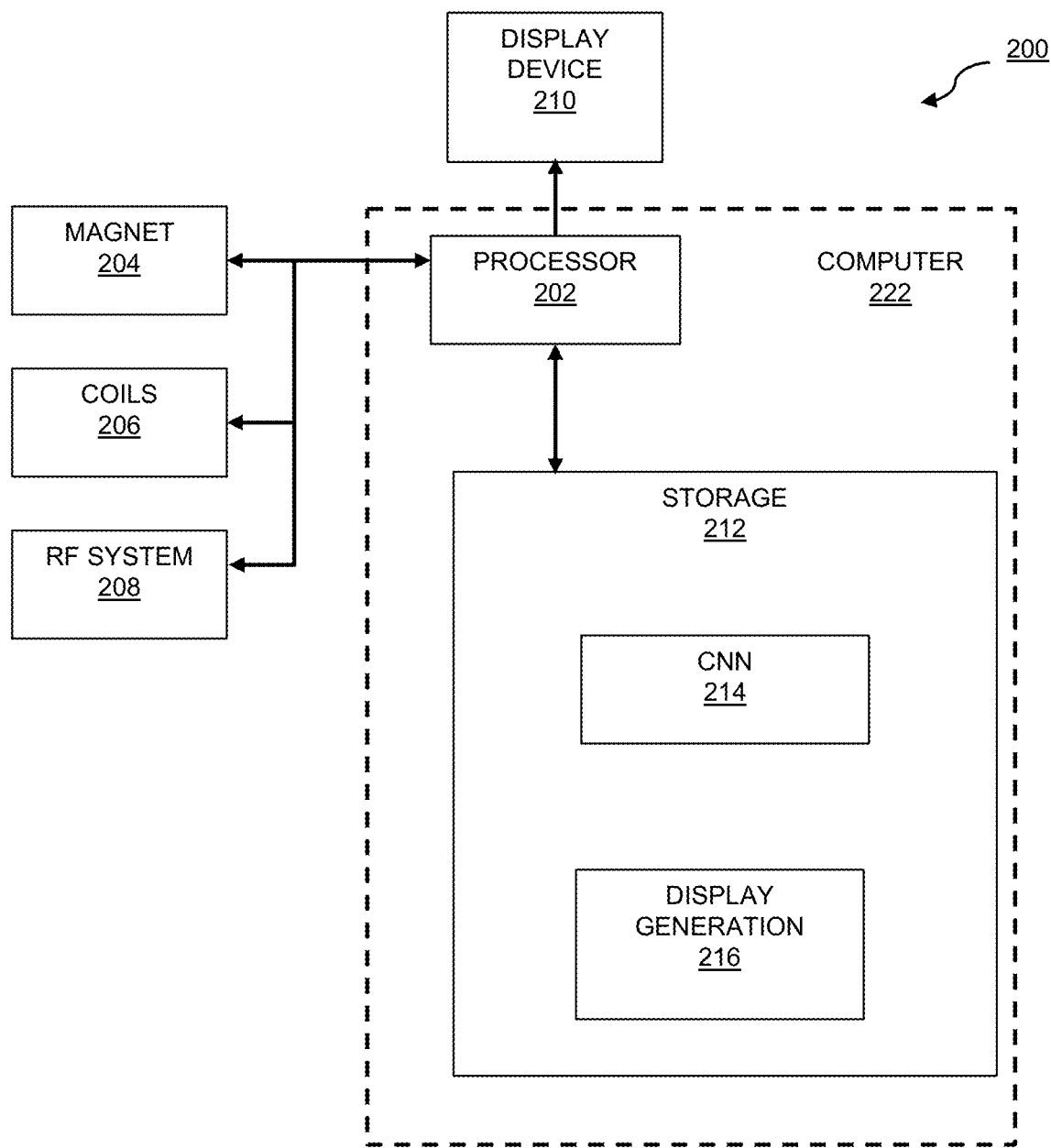
FIG. 2 is a block diagram of an exemplary imaging system in accordance with various embodiments of the invention.

FIG. 2 provides a block diagram of an exemplary magnetic resonance (MR) imaging system 200 in accordance with various embodiments. The system 200 includes a main magnet 204 to polarize the sample/subject/patient; shim coils 206 for correcting inhomogeneities in the main magnetic field; gradient coils 206 to localize the MR signal; a radio frequency (RF) system 208 which excites the sample/ subject/patient and detects the resulting MR signal; and one or more computers 222 to control the aforementioned system components.

A computer 222 of the imaging system 200 comprises a processor 202 and storage 212. Suitable processors include, for example, general-purpose processors, digital signal processors, and microcontrollers. Processor architectures generally include execution units (e.g., fixed point, floating point, integer, etc.), storage (e.g., registers, memory, etc.), instruction decoding, peripherals (e.g., interrupt controllers, timers, direct memory access controllers, etc.), input/output systems (e.g., serial ports, parallel ports, etc.) and various other components and sub-systems. In the examples described herein, a GPU workstation running Ubuntu 16.04, equipped with a NVIDIA Titan V or Titan Xp GPU. The storage 212 includes a computer-readable storage medium.

Software programming executable by the processor 202 may be stored in the storage 212. More specifically, the storage 212 includes software modules comprising instructions that, when executed by the processor 202, cause the processor 202 to acquire magnetic resonance (MRI) data in the region of interest ("ROI") and process it using a CNN module 214 (U-Net 100), which module includes standard functions such as a concatenator module and a Softmax module (not separately designated), and to generate graphical images for display (module 216), e.g., on display device 210, which may be any device suitable for displaying graphic data. More particularly, the software instructions stored in the storage 212 cause the processor 202 to display the 2D super-resolution output image, possibly along with additional supporting information.

Additionally, the software instructions stored in the storage 212 may cause the processor 202 to perform various other operations described herein. In some cases, one or more of the modules may be executed using a second computer of the imaging system. (Even if the second computer is not originally or initially part of the imaging system 200, it is considered in the context of this disclosure as part of the imaging system 200.) In this disclosure, the computers of the imaging system 200 are interconnected and configured to communicate with one another and perform tasks in an integrated manner. For example, each computer is provided access the other's storage.

Figure 1:
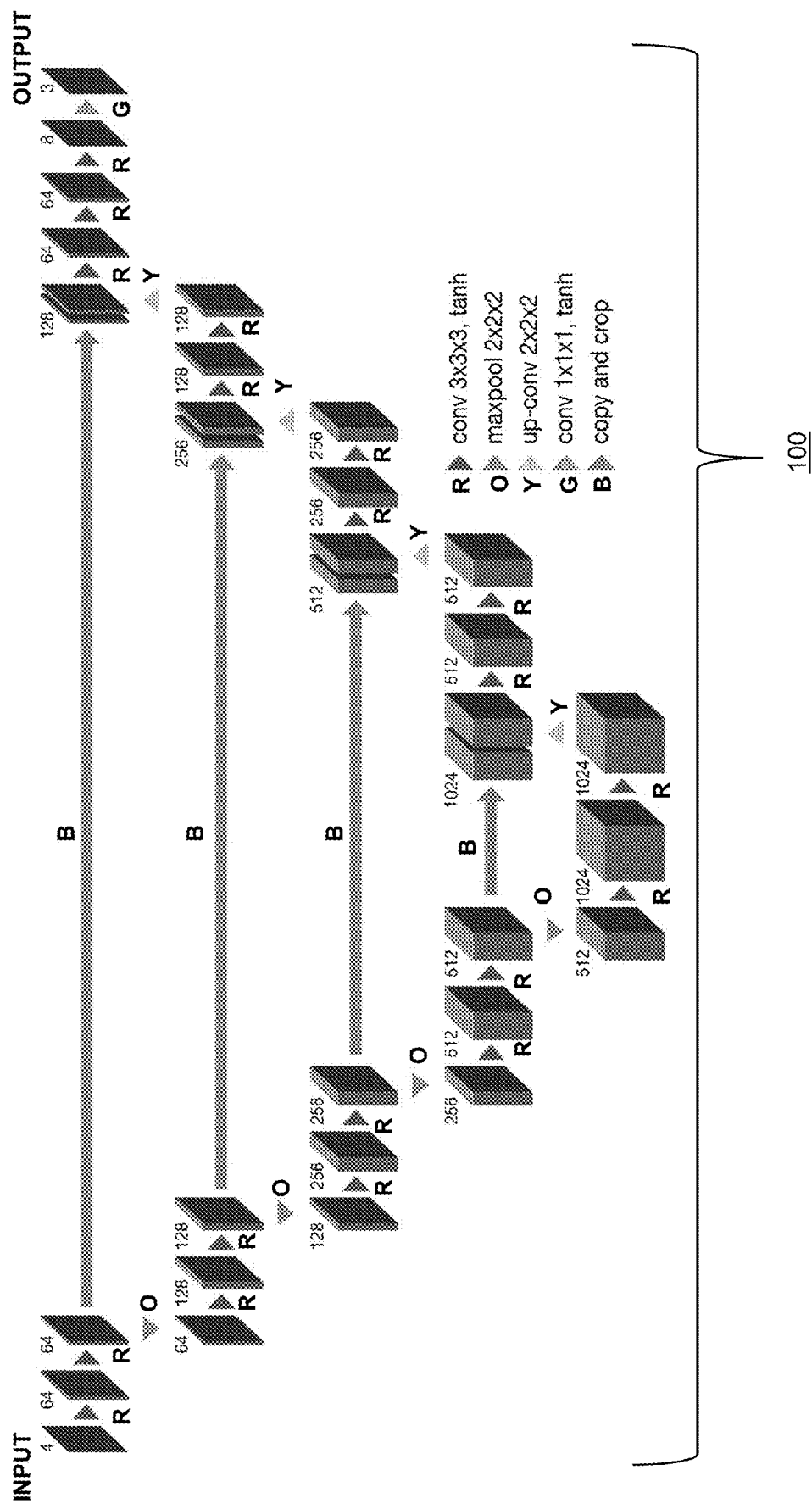
FIG. 1 illustrates an exemplary architecture of the 3D multichannel U-Net according to an embodiment of the inventive method.

FIG. 1 illustrates the architecture of the three-dimensional (3D) multichannel U-Net 100 used in implementation of an embodiment of the automated phase error correction scheme. Four input channels include flow velocities encoded in three cardinal directions and corresponding magnitude volumes. The three output channels infer corrections for the same three velocity components. The numbers of channels in each U-net layer (e.g., 1, 32, 64, etc.) are shown above the bars. Kernel sizes and activation functions indicated in the figure legend. The operations (convolutions, max pooling, up-conversions, and copy and crop) are represented in the figures as color coded arrowheads, where red ("R") indicates 3×3×3 convolution followed by a tan h (hyperbolic tangent activation) function, orange ("O") represents a max pooling operation, 2×2×2; yellow ("Y") indicates a 2×2×2 up-conversion; green ("G") indicates 1×1×1 convolution followed by a tan h (hyperbolic tangent activation) function. Blue ("B") arrows indicate copying and cropping of the images prior to further processing.

Figure 3:
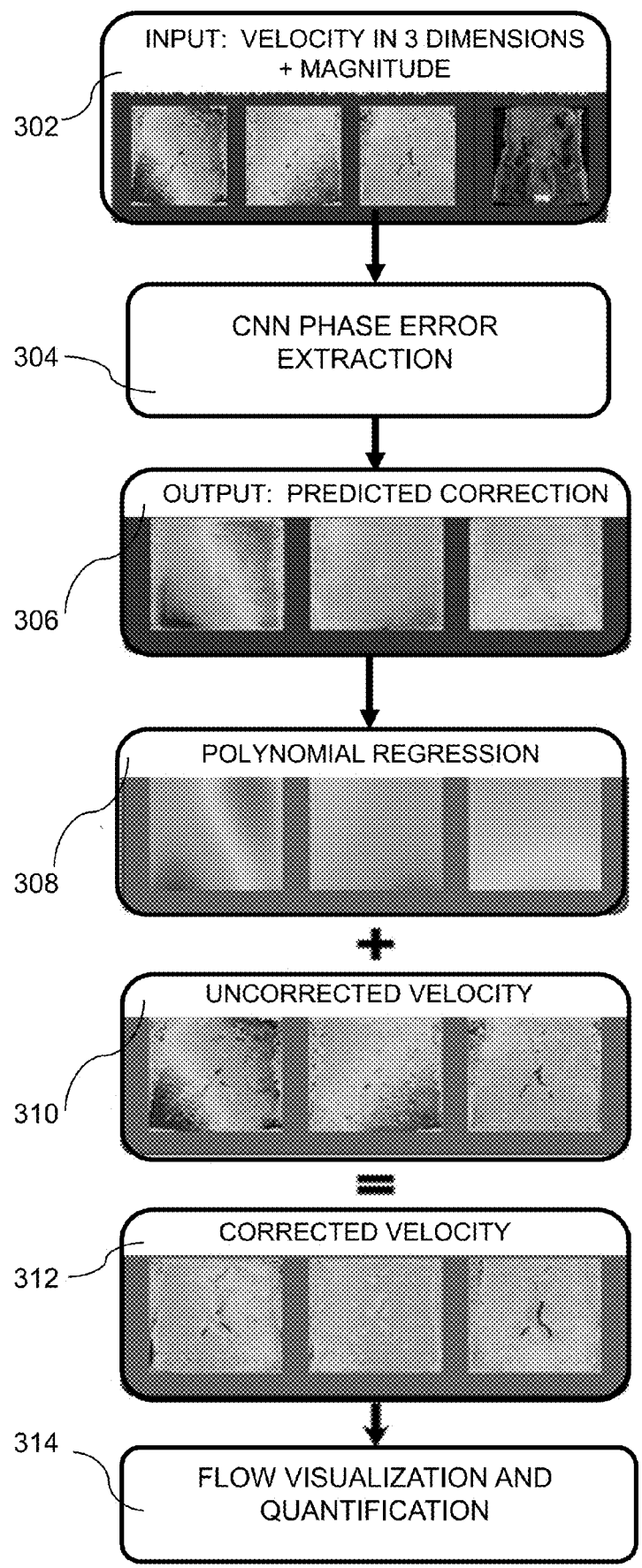
FIG. 3 illustrates the sequence for a pipeline for automated phase error correction according to the inventive approach.

CNN-predicted velocity corrections for the three velocity components were then reduced to third-order polynomial least-squares approximations, which were added to the uncorrected velocity arrays to generate polynomial-corrected velocities. FIG. 3 illustrates the sequence for a pipeline for automated phase error correction according to the inventive approach. The three-dimensional (3D) multichannel U-Net 100 (shown in FIG. 1) receives four input channels in step 302, the input including flow velocities encoded in three cardinal directions and corresponding magnitude volumes. The trained CNN performs phase error extraction in step 304, generating three output channels to infer corrections for the same three velocity components. As a postprocessing step, pixelwise inferred corrections are smoothed with least squares regression to a third-order polynomial in step 308. This correction is then added to the original uncorrected data in step 310 to generate corrected flow data in step 312. The corrected data may then be used for flow visualization and quantification in step 314.

The following examples demonstrate the feasibility of training a multichannel 3D U-Net to simultaneously predict velocity field corrections for all three velocity components in a 3D volume, producing inflow-outflow consistency comparable to manual correction. Incorporation of CNN-based automated background phase-error correction into existing visualization and analysis software streamlines the current data processing workflow, improving the utility of 4D Flow MRI as a versatile instrument for clinical diagnosis and research.

Example 1

Abdominal 4D Flow MRI

With IRB approval and HIPAA compliance, we retrospectively collected 26 abdominal 4D Flow MRI acquisitions performed as part of routine clinical MRI examinations. Examinations were completed on 3T 750 MRI (GE Healthcare, Milwaukee, Wisconsin) using a 32-channel phased-array coil. 4D Flow MRI was performed with a 3D cartesian strategy in which (Ky–Kz) samples were grouped in spiral-like sets and acquired with golden angle ordering, evenly spaced over time with dense central k-space sampling for respiratory soft gating. Encoding velocity ranged from 80 to 250 cm/s. Vessel segmentation and manual phase-error correction were performed using dedicated imaging software (Arterys, San Francisco, CA) and supervised by a board-certified radiologist with more than a decade of experience working with 4D Flow. Manual correction was performed via segmentation of static tissue followed by a patch-wise linear regression of static tissue velocities. After 30% of the data (8 patients) was reserved for testing, the remaining 70% (18 patients) was used to train a multichannel, 3D convolutional neural network (CNN). Architecture of the U-Net, discussed previously, is shown in FIG. 1. The input data, an example of which is shown in panel 302 of FIG. 3 includes velocity in three dimensions and magnitude.

Figure 4:
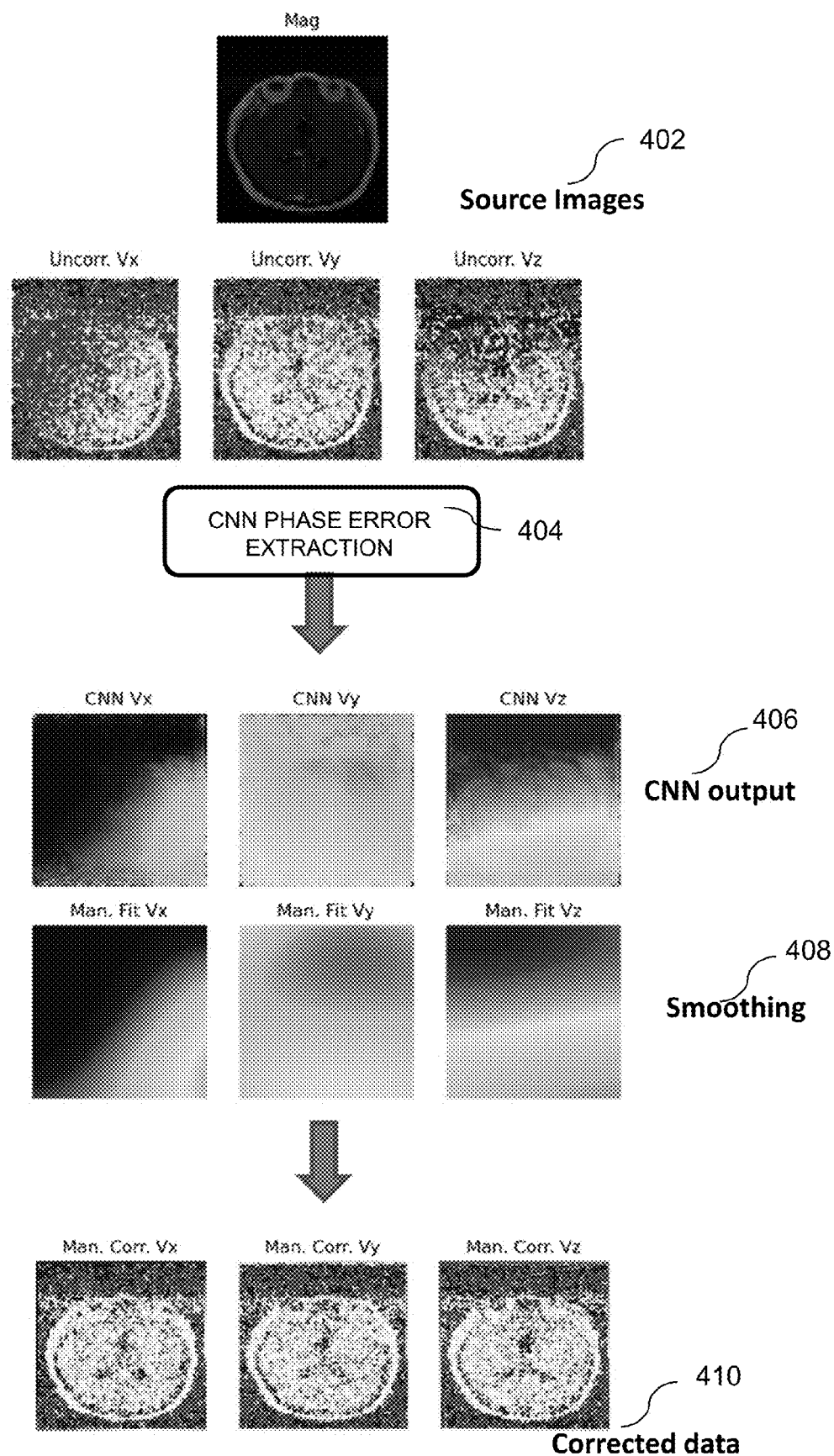
FIG. 4 illustrates a sample data flow sequence for the inventive CNN automated phase-error correction approach with postprocessing.

CNN-predicted velocity corrections for the three velocity components were reduced to third-order polynomial least-squares approximations, which were added to the uncorrected velocity arrays to generate polynomial-corrected velocities. The postprocessing pipeline is illustrated in FIG. 4, which illustrates a sample data flow sequence for the inventive CNN automated phase-error correction approach with postprocessing. 4D Flow source images 402, from which magnitude and uncorrected velocity data in three directions: $V_x$, $V_y$ and $V_z$, are obtained are input into a CNN 404 trained to extract background phase-error fields. The three dimensional CNN output 406 (velocity data $V_x$, $V_y$ and $V_z$) is processed with a polynomial fit (labeled "Man. Fit")

in each direction to smooth errors in CNN inference. This polynomial fit correction 408 is applied and used to correct the velocity data 410.

Segmentation for flow quantification was performed for the infrarenal aorta in triplicate, and individually for the right and left common iliac arteries (LCIA, RCIA), inferior vena cava (IVC), and left and right common iliac veins (LCIV, RCIV). Internal consistency of flow measurements was established by assessing conservation of mass. The aorta was compared to the LCIA+RCIA, while the IVC was compared to the LCIV+RCIV. Each arterial vessel was compared to its venous counterpart (aorta vs. IVC, LCIA vs. LCIV, and RCIA vs. RCIV). Statistical comparisons between uncorrected, manually-corrected, and polynomial-corrected flow were assessed using Bartlett's test of homogeneity of variances followed by pairwise F-tests with Holm correction (R Foundation for Statistical Computing, Vienna, Austria).

Figure 5:
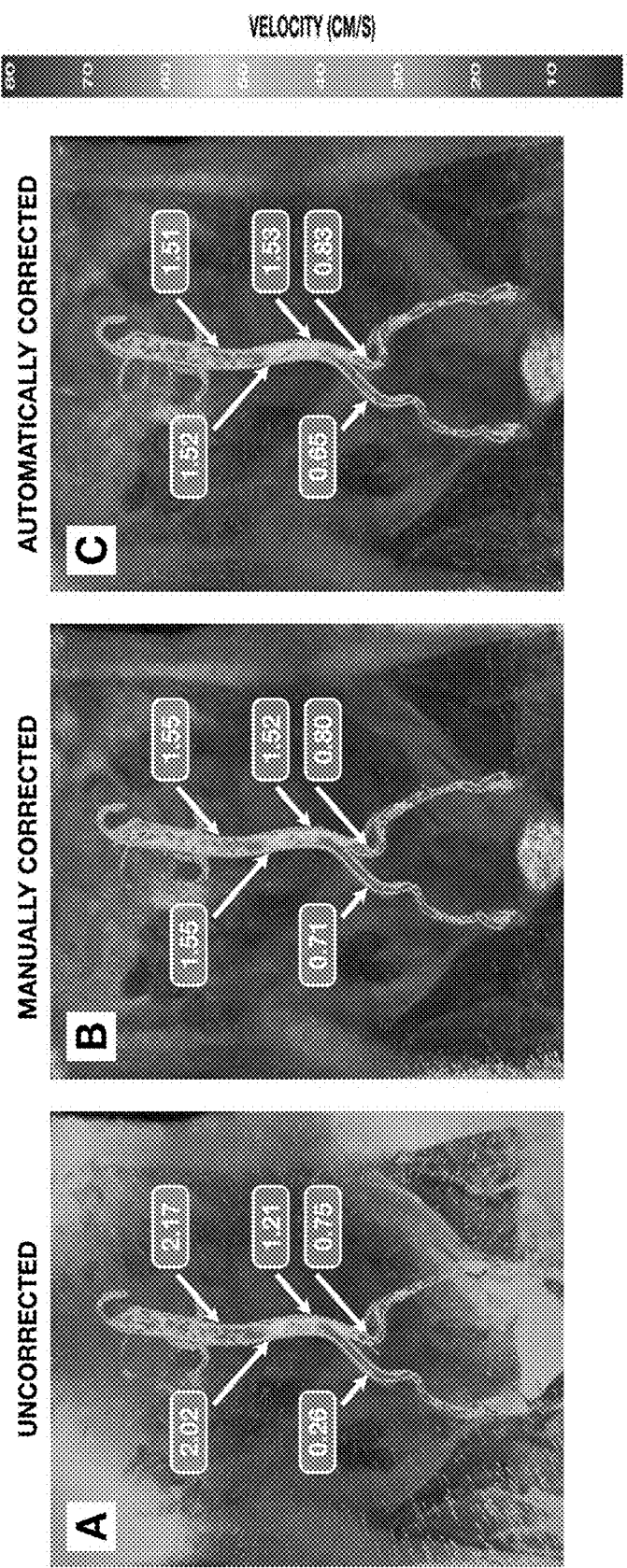
FIG. 5 representative visual examples of uncorrected (panel A, left), manually-corrected (panel B, center), and automatically-corrected (panel C, right) flow measurements.
Figure 6:
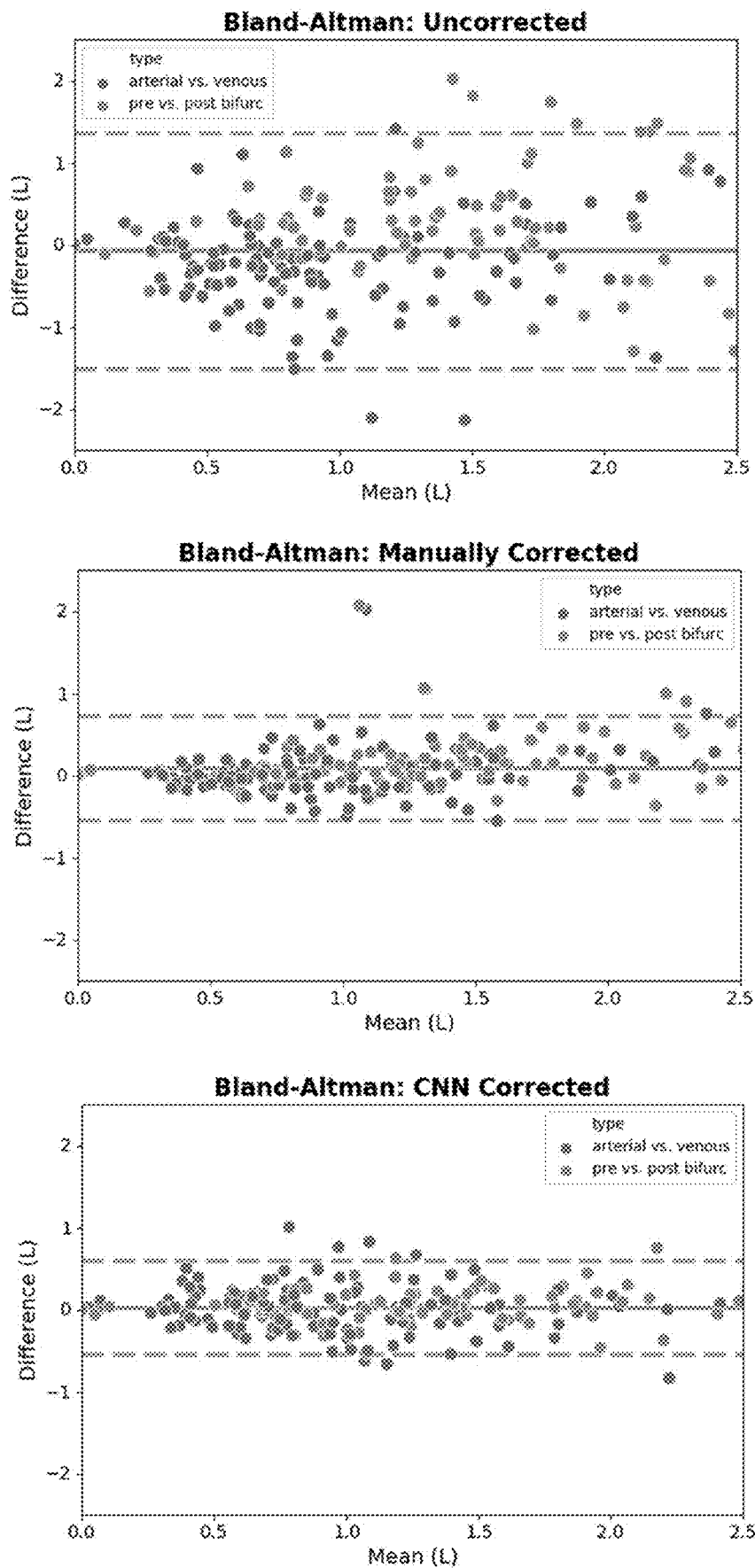
FIG. 6 shows Bland-Altman plots comparing consistency of flow measurements for (panel A) uncorrected velocity data, (panel B) velocity data corrected manually, and (panel C) velocity data corrected automatically.

For the uncorrected velocity data, mean difference and 95% limits of agreement (LoA) of flow measurements were as follows: 0.24 (−1.22, 1.71) L/min for arterial vs. venous flow, −0.14 (−1.66, 1.38) L/min for pre- vs. post-bifurcation flow, and 0.09 (−1.44, 1.62) overall. For the manually corrected velocity data, mean difference and 95% LoA were as follows: −0.04 (−0.33, 0.25) L/min for arterial vs. venous flow, −0.12 (−0.32, 0.08) L/min for pre- vs. post-bifurcation flow, and −0.07 (−0.34, 0.2) overall. For the automatically corrected velocity data, mean difference and 95% LoA were as follows: 0.0 (−0.4, 0.4) L/min for arterial vs. venous flow, −0.04 (−0.22, 0.13) L/min for pre- vs. post-bifurcation flow, and −0.02 (−0.35, 0.32) overall. FIG. 5 provides representative visual examples of uncorrected (panel A, left), manually-corrected (panel B, center), and automatically-corrected (panel C, right) flow measurements. Bland-Altman plots comparing mean difference and LoA are shown in FIG. 6, uncorrected (top), manually-corrected (center), and corrected (bottom). Bartlett's test comparing all three groups yielded an overall p-value of less than 2.2e-16, while pairwise F-tests with Holm correction resulted in p<2.2e-16 for uncorrected vs. manually corrected data, p<2.2e-16 for uncorrected vs. neural network corrected data, and p=0.21 for manually corrected vs. automatically corrected data.

Figure 7:
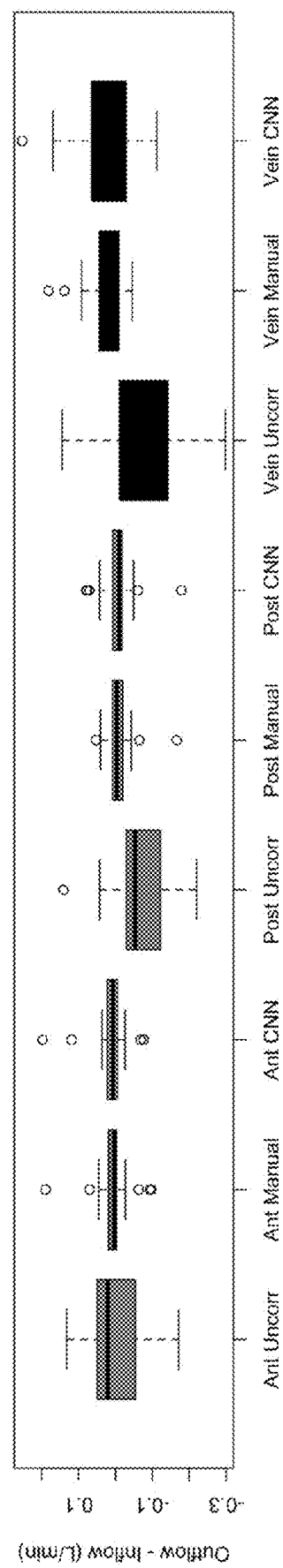
FIG. 7 plots consistency of blood flow measurements at multiple locations, showing improvement after application of either manual or fully-automated correction using a CNN.

Following phase-error correction by either manual or CNN-based automated methods, there was improved consistency in flow continuity, observed in comparisons of arterial and venous flow as well as in comparisons of blood flow before and after bifurcations. In a small test population of 8 subjects, there was no statistically significant difference between manual and automatic corrections of background phase offset. FIG. 7 plots consistency of blood flow measurements at multiple locations, showing improvement after application of either manual or fully-automated correction using a CNN. The plotted inflow-outflow comparisons included anterior circulation (right and left): ICA compared to sum of ACA and MCA; Posterior circulation: Vertebral artery compared to sum of PCA; and Venous circulation: Sum of Superior sagittal and straight sinus compared to sum of transverse sinuses.

Example 2

Abdominal 4D Flow MRI-Larger Sample

Following HIPAA rules and with IRB approval, we retrospectively collected a convenience sample of 139 abdominopelvic 4D flow MRI acquisitions performed between January 2016 and July 2020 as part of routine clinical MRI examinations, which also included contrast-enhanced MR angiography and postcontrast fast spoiled gradient-echo imaging. Table 1 summarizes the patient characteristics.

TABLE 1

| Parameter | Training Data Set (n = 85) | Validation Data Set (n = 14) | Testing Data Set (n = 40) | Total (n = 139) |
|---|---|---|---|---|
| Gender | | | | |
| Female | 63 | 10 | 35 | 108 |
| Male | 22 | 4 | 5 | 31 |
| Age (y)* | 48 ± 15 | 52 ± 15 | 43 ± 13 | 47 ± 14 |
| Clinical indication | | | | |
| Liver Disease | 25 | 4 | 6 | 35 |
| Uterine bleeding and masses, including fibroids | 30 | 3 | 21 | 54 |
| Venous congestion | 15 | 5 | 9 | 29 |
| Mesenteric ischemia | 6 | 0 | 0 | 6 |
| Renal artery stenosis | 9 | 2 | 4 | 15 |

*Data are mean plus standard deviation.

MRI examinations were performed on a 3-T MRI scanner (Discovery MR 750; GE Healthcare) using a 32-channel phased-array coil. Postcontrast 4D flow MRI was performed with a 3D cartesian strategy in which Ky–Kz samples were grouped in spiral-like sets and were acquired with golden angle ordering, evenly spaced over time with dense central k-space sampling for respiratory soft gating. Imaging parameters for time-resolved 3D phase-contrast MRI with 3D velocity encoding are summarized in Table 2 below. The 4D flow MRI scans were acquired as a coronal slab through the abdomen and pelvis, with the patient's arms raised above their head to prevent soft-tissue wrapping in the right-left phase direction.

TABLE 2

| Parameter | Training Data Set (n = 85) | Validation Data Set (n = 14) | Testing Data Set (n = 40) |
|---|---|---|---|
| Temporal resolution (msec) | 56 (38-175) | 57 (45, 87) | 56 (43, 74) |
| Spatial resolution (mm) | | | |
| Frequency | 1.7 (1.3-2.5) | 1.7 (1.6-2.0) | 1.7 (1.6-1.9) |
| Phase | 2.1 (1.7-3.0) | 2.0 (1.9-2.4) | 2.0 (1.9-2.3) |
| Section | 3.0 (2.8-7.5) | 2.8 (2.8-3.0) | 2.8 (2.8-3.0) |
| Encoding velocity (cm/sec) | 148 (80-200) | 141 (80-250) | 150 (80-250) |

TABLE 2-continued

| Parameter | Training Data Set (n = 85) | Validation Data Set (n = 14) | Testing Data Set (n = 40) |
|---|---|---|---|
| Acceleration factor | | | |
| Phase | 3.0 (1.2-3.2) | 3.0 (2.6-3.2) | 3.0 (2.6-3.2) |
| Section | 1.8 (1.2-2.0) | 1.8 (1.8-2.0) | 1.8 (1.8-2.0) |
| Scanning time (sec.) | 674 (409-810) | 707 (630-808) | 674 (357-840) |
| Contrast agent (%) | | | |
| Gadobutrol | 78 (66/85) | 86 (12/14) | 90 (36/40) |
| Gadobenate dimeglumine | 15 (13/85) | 7 (1/14) | 10 (4/40) |
| Gadoxetate disodium | 7 (6/85) | 0 (0/14) | 0 (0/40) |
| Gadofosveset trisodium | 0 (0/85) | 7 (1/14) | 0 (0/40) |

Note that data for imaging parameters are presented as means, with ranges in parentheses. Data for contrast agents are presented as percentages, with raw data in parentheses.

Manual phase error correction was performed with dedicated imaging software (Arterys, version 26.7.6; Arterys) by a fourth year medical student and a board-certified radiologist with more than 10 years' experience working with 4D flow MRI). Manual correction was performed via segmentation of static tissue followed by patchwise linear regression of static tissue velocities. Raw uncorrected and corrected velocity data were exported from the imaging software.

After 40 examinations were reserved for testing, the remaining 1980 temporal volumes from 99 examinations were randomly divided by examination into two cohorts, with 86% (85 of 99) for training and 14% (14 of 99) for validation. Maxwell terms and gradient field nonlinearity were corrected in-line during the image reconstruction process. After performing semiautomatic thresholding of magnitude images for exclusion of air pixels, velocity values corresponding to unexcluded pixels were used to generate a third-order polynomial regression of the manual correction. Velocities were scaled by the encoding velocity for each examination, and all data were downsampled to 64×64×64 cubes due to anticipated GPU memory limitations.

The previously-described 3D multichannel U-Net (shown in FIG. 1) was trained for 300 epochs using mean squared error loss, hyperbolic tangent activation, and Adam optimization with a learning rate of $1\times10^{-4}$. Network training used TensorFlow-GPU 2.1 (Google) on a workstation running Ubuntu 18.04 (Canonical) equipped with four Nvidia Quadro GV100 GPUs (Nvidia).

The pipeline for automated phase error correction is shown in FIG. 3, in which the multichannel U-Net has four input channels, including flow velocities encoded in three cardinal directions and corresponding magnitude volumes (step 302), and three output channels (step 306) to infer corrections for the same three velocity components. For postprocessing in step 308, pixelwise inferred corrections are smoothed with least squares regression to a third-order polynomial. This correction is then added to the original uncorrected data in step 310 to generate corrected flow data in step 312. The corrected data may then be used for flow visualization and quantization.

Pixelwise velocity corrections generated by the CNN were supplied as input to third-order polynomial least-squares regression after intensity thresholding for exclusion of air pixels. A single-phase error correction was generated for each examination, computed as the average of corrections generated for each of the 20 time points in the 4D flow time series.

Segmentation of vessels for flow quantification was performed by two observers for the infrarenal aorta in triplicate and individually for the left common iliac artery (LCIA) and right common iliac artery (RCIA), inferior vena cava, left common iliac vein (LCIV), and right common iliac vein (RCIV). The same manual segmentations were used for uncorrected, manually corrected, and automatically corrected data, such that measurements between the three data sets were spatially consistent.

Figure 8:
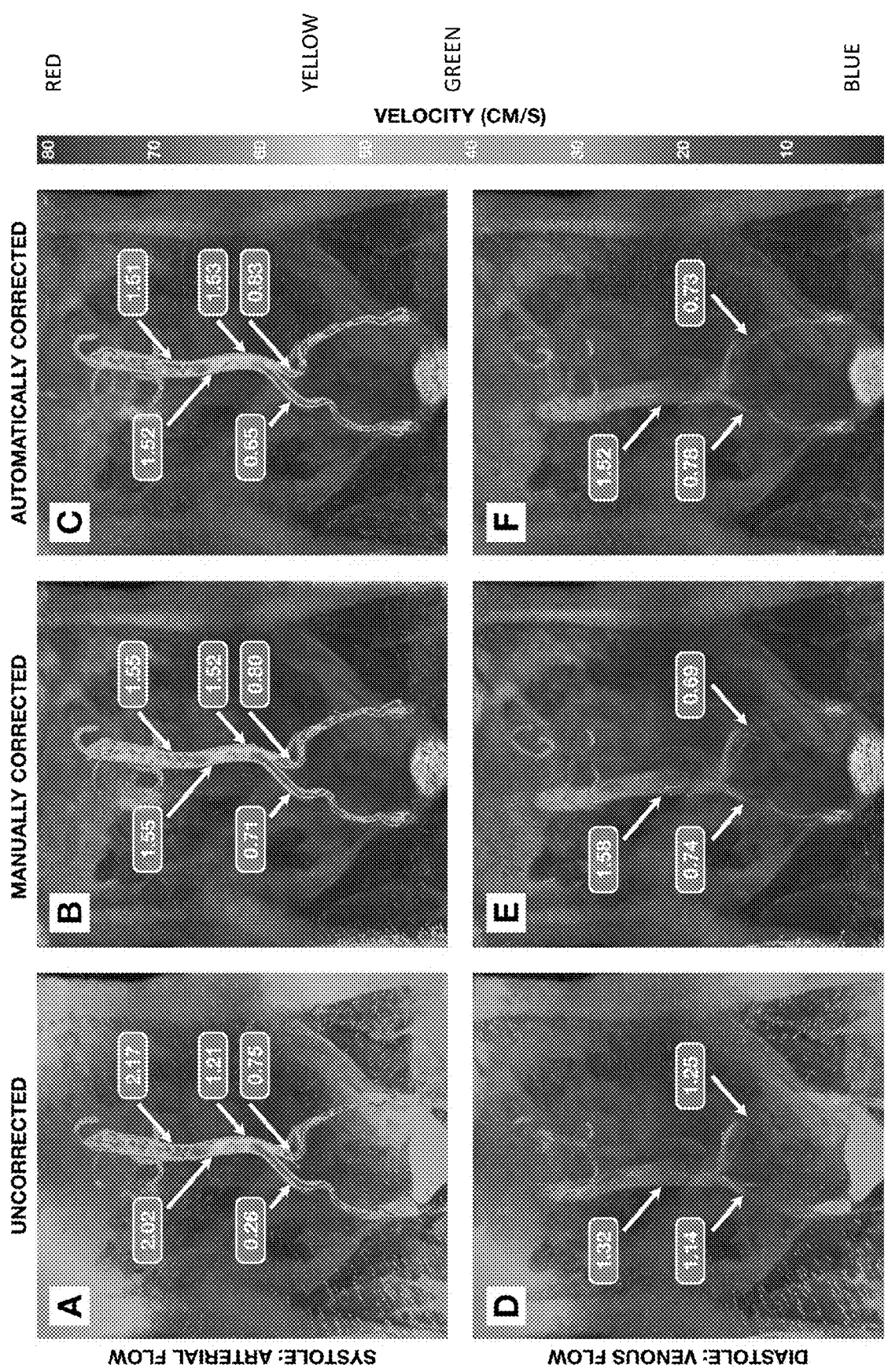
FIG. 8 illustrates sample images demonstrating visual and quantitative reduction of background phase error in arterial and venous flow after manual or convolutional neural network (CNN)-based correction compared to uncorrected.

Internal consistency of flow measurements was established by assessing conservation of mass in the 40 test cases. The average of the three aortic measurements was compared with the sum of the LCIA and RCIA, while the inferior vena cava was compared with the sum of the LCIV and RCIV. Each arterial vessel was compared with its venous counterpart (aorta vs inferior vena cava, LCIA vs LCIV, and RCIA vs RCIV). A representative case from the test set showing the 24 total measurements per case is shown in FIG. 8. Images show visual and quantitative reduction of background phase error after manual or convolutional neural network (CNN)-based correction. Panels A-C show coronal MRI scans of the aorta and common iliac arteries during peak systole, uncorrected, manually corrected, and automatically corrected, respectively. Panels D-F show coronal MM scans of the inferior vena cava and common iliac veins during mid-diastole, uncorrected, manually corrected, and automatically corrected, respectively. Flow velocity is represented by a color map ranging from blue (0 cm/sec) to red (80 cm/sec). For assessment of flow continuity, measurements (in liters per minute) were taken at multiple locations indicated by the white arrows. Corrected velocity measurements showed improved consistency along the length of the infrarenal aorta and conservation of mass across bifurcations in the arterial and venous systems.

Still referring to FIG. 8, prior to background phase error correction, there was poor inflow-outflow consistency for comparison of arterial flow with venous flow and for comparison of blood flow before bifurcation with blood flow after bifurcation (panels A and D). The mean absolute difference between flow measurements was 0.52 L/min±0.55 (standard deviation), while the mean percentage difference was 37%±26. Correlation between flow measurements was moderate ($\rho=0.50$, $P<0.001$). After manual correction (panels B and E), the mean absolute difference improved to 0.15 L/min±0.12, with a corresponding mean percentage difference of 14%±10. Corrected flow measurements shown in panels C and F also demonstrated very strong correlation between inflow and outflow measurements ($\rho=0.94$, $P<0.001$).

For the 40 test cases, t tests were performed with a difference of zero as the null hypothesis for the five comparisons assessing conservation of mass and a type I error threshold of P<0.01 ($\alpha$=0.05 with Bonferroni correction for multiple comparisons). Additional statistical comparisons were performed using the Bartlett test of homoscedasticity followed by pairwise F tests with Bonferroni correction. These analyses were performed in RStudio 1.3.959 (R Foundation for Statistical Computing).

Inflow-outflow consistency in the test set was further assessed using Pearson correlation and Bland-Altman analysis. The time required for manual versus automated correction was assessed using a t test. We fitted a single-rater two-way random effects intraclass correlation model to assess absolute agreement between flow measurements made by two observers. These statistical analyses were performed using the Scipy 1.4.1 and Pingouin 0.3.12 libraries in Python (version 3.7.7).

Example 3

Clinical Applications of 4D Flow MRI

Figure 9:
FIG. 9 illustrates two sample cases of manually corrected 4D flow MRI in which clinical diagnosis was facilitated.

FIG. 9 illustrates two sample cases in which manually corrected 4D flow MRI was helpful for diagnosis. In the first example case (panels A-C), a 24-year-old woman with postural orthostatic tachycardia syndrome presented with orthostatic lightheadedness, left leg discomfort, and abdominopelvic pressure that worsened throughout the day. She underwent multisequence MRI, including differential subsampling with cartesian ordering, which demonstrated dilated ovarian veins bilaterally and filling of pelvic venous collaterals. Further evaluation with 4D flow MRI enabled us to confirm retrograde flow in the left ovarian vein (280 mL/min) and anterograde flow in the right ovarian vein (230 mL/min). There was absent flow in the left renal vein as it passed under the superior mesenteric artery, indicating nutcracker physiology. There was limited flow (270 mL/min) in the LCIV as it passed under the RCIA, which was inadequate to accommodate the retrograde ovarian venous flow, indicating May-Thurner venous insufficiency. Panels A-C show coronal oblique MRI scans obtained with postcontrast 4D flow MRI (panel A) and MR angiography (panel B), showing the asymmetrically enlarged left ovarian vein (LOV) (red arrow) and antegrade flow in the enlarged contralateral ovarian vein (blue arrow). In panel A, AO=aorta, IVC=inferior vena cava, LCIA=left common iliac artery, RCIA=right common iliac artery, RCIV=right common iliac vein, ROV=right ovarian vein. In panel C, both retrograde ovarian flow and left common iliac vein (LCIV) stenosis were confirmed during catheter angiography, with flow through the compressed LCIV (black arrow) being restored after stent placement.

The patient subsequently underwent catheter venography, which enabled us to confirm left ovarian vein reflux and left iliac venous insufficiency. This was followed by LCIV stenting, resolution of May-Thurner venous insufficiency and left leg discomfort, and, later, left gonadal vein embolization with resolution of her abdominal bloating, urinary discomfort, and pelvic pain.

In a second example case, an 89-year-old woman with a history of ischemic colitis underwent abdominal MRI for evaluation of persistent abdominal pain and diarrhea. FIG. 9, panels D-F are sagittal oblique images in the two-dimensional MR angiography image (panel D) and three-dimensional (3D) reconstruction (panel E). Postcontrast 4D flow MRI scan (panel F) shows similar narrowing and provides additional hemodynamic information: high flow velocity is shown in red, and persistent high-velocity flow in the celiac artery during diastole is reflected in the corresponding flow curves. Quantitative flow measurements using two-dimensional phase-contrast MRI demonstrated limited augmentation of mesenteric blood flow after a prandial challenge, with flow through the superior mesenteric vein increasing from 299 to 330 mL/min and flow through the superior mesenteric artery increasing from 386 to 414 mL/min. Postprandial 4D flow MRI measurements were obtained to assess the feasibility of using 4D flow in place of two-dimensional phase-contrast planes, and the 4D flow measurements were found to be similar to the two-dimensional phase-contrast flow measurements. We observed several additional findings on 4D flow MRI scans, including high-velocity systolic blood flow through the celiac (159.41 cm/sec) and superior mesenteric (136.33 cm/sec) arteries and prolonged diastolic forward flow through the stenotic celiac artery (panel F). Taken together, these findings are consistent with hemodynamically significant celiac and superior mesenteric artery stenosis and chronic mesenteric ischemia.

Example 4

Performance of Automated Phase Error Correction

Neural network inference required a mean of 0.54 second±0.01 per case, while postprocessing required a mean of 11.75 seconds±0.61 per case. The mean total time for automated phase error correction was 12.29 seconds±0.61 compared with manual phase error correction performed by a highly experienced observer, which required 152.3 seconds±52.58 per case (P<0.001).

The multichannel 3D U-Net led to an improvement in inflow-outflow consistency comparable to that of manual correction, with strong correlation between flow measurements ($\rho$=0.91, P<0.001). The average standard deviation for the three aortic measurements performed for each case was 0.07 L/min, compared with 0.07 L/min after manual correction and 0.23 L/min for uncorrected cases. The CNN algorithm was successfully executed in all 40 test cases, resolving phase error in all three principal directions with no technical failures.

Figure 10A:
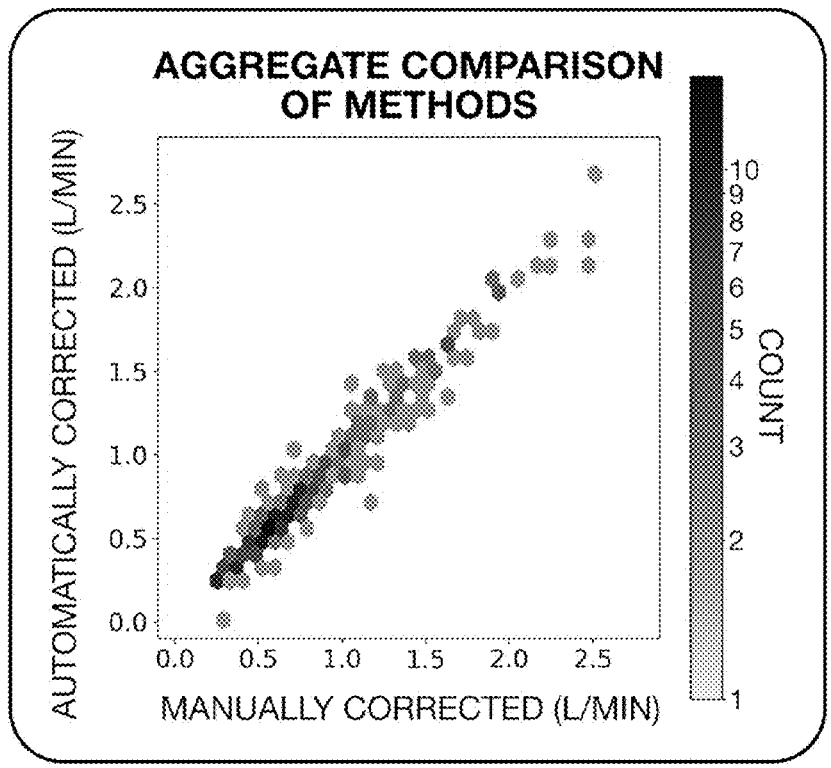
FIGS. 10A-10C are plots demonstrating improvements provided by phase-error correction, where

FIG. 10A provides a direct comparison of flow measurements obtained using manual and automated correction, demonstrating very strong correlation: regression slope 1.01, $\rho$=0.98, P<0.001.

Figure 10B:
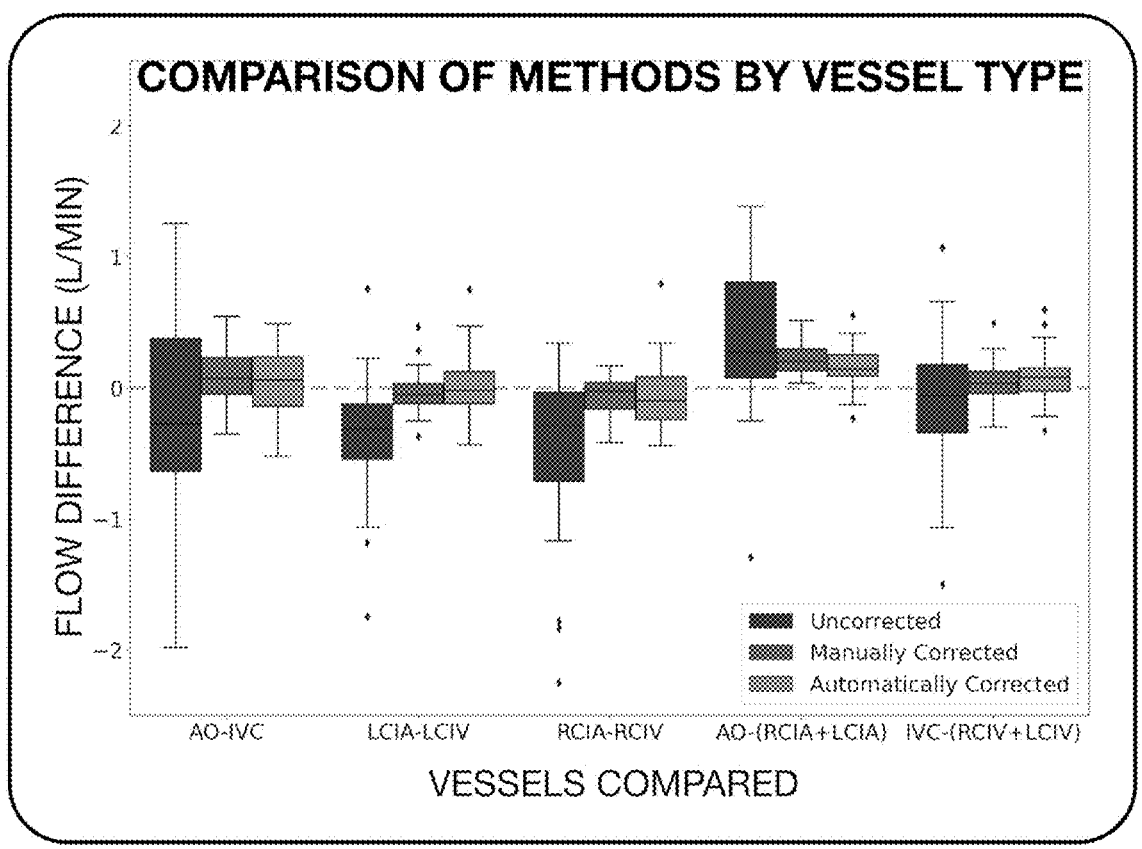

FIG. 10B is a box-and-whisker plot grouped by vessel type comparing uncorrected, manually corrected, and automatically corrected flow differences among the five vessel comparisons. Compared with uncorrected measurements, manually and automatically corrected measurements show an overall reduction in range, with mean values closer to zero. AO=aorta, IVC=inferior vena cava, LCIA=left common iliac artery, LCIV=left common iliac vein, RCIA=right common iliac artery, RCIV=right common iliac vein.

Figure 10C:
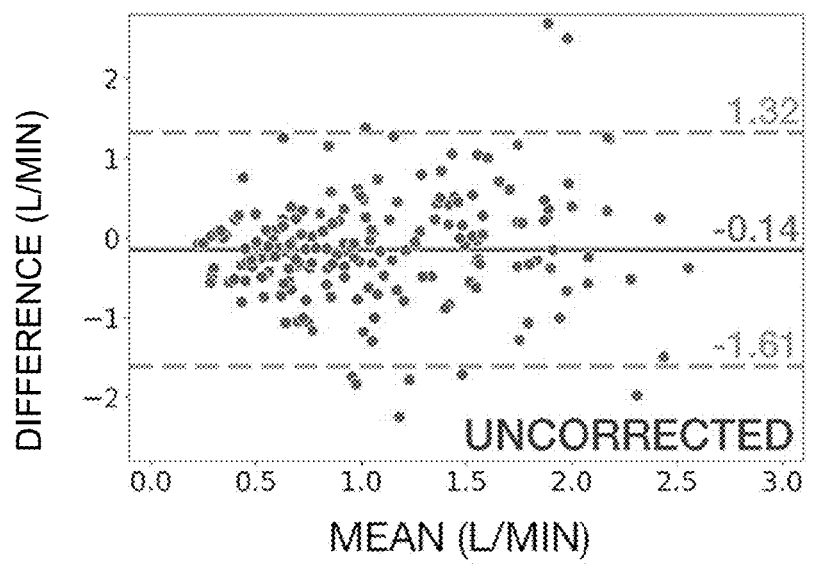
Figure 10C:
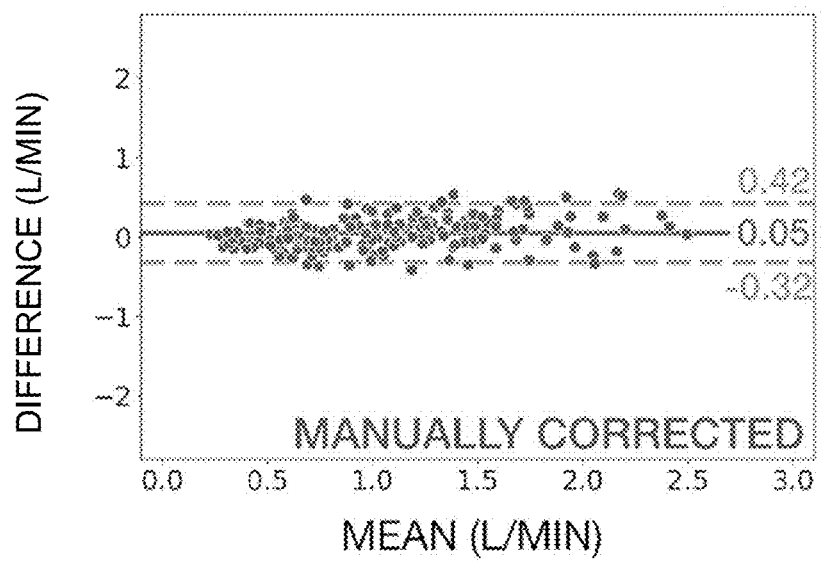
Figure 10C:
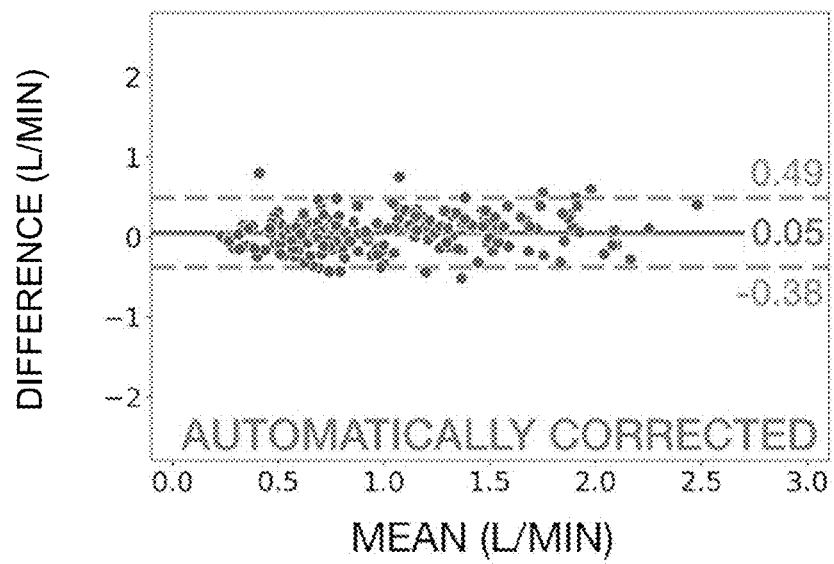

FIG. 10C provides Bland-Altman plots with comparisons of arterial and venous flow (red) and comparisons of flow before and after bifurcation (blue), showing greater flow consistency with narrower limits of agreement for both manually corrected (center panel) and automatically corrected results.

The multichannel 3D U-Net used in the inventive approach achieved an average difference between vessel measurements of 0.05 L/min overall (P<0.001), an improvement over uncorrected measurements, which had an average difference of −0.14 L/min overall (P=0.01). In comparison, manual correction had an average difference of 0.05 L/min (P<0.001). When considering only comparisons of arterial flow versus venous flow, both correction methods showed marked improvement over uncorrected data, with mean differences of −0.005 L/min (P=0.79) after manual correction and −0.003 L/min (P=0.89) after automated correction compared with −0.35 L/min for uncorrected data (P<0.001). Comparisons between pre- and postbifurcation flow also showed an improvement in mean difference from 0.17 L/min uncorrected to 0.14 L/min manually corrected and 0.13 automatically corrected, though the mean difference remained greater than zero for both correction methods (P=9.02 for uncorrected, P<0.001 for manually corrected, P<0.001 for automatically corrected). Uncorrected data demonstrated a mean difference significantly different from zero for three of the five vessel comparisons (P<0.001 for the difference between the LCIA and LCIV, the difference between the RCIA and RCIV, and the difference between the aorta and the sum of the RCIA and LCIA, while manually and automatically corrected vessel comparisons were significantly different from zero (P<0.001 and P<0.001, respectively) for only the difference between the aorta and the sum of the RCIA and LCIA. Table 3 summarizes the results for the five vessel comparisons.

TABLE 3

| Vessel Comparison | Uncorrected | | Manually Corrected | | Automatically Corrected | |
|---|---|---|---|---|---|---|
| | Mean | P Value | Mean | P Value | Mean | P Value |
| AO to IVC | −0.27 (−0.62, 0.08) | .13 | 0.08 (0.01, 0.15) | .03 | 0.05 (0.03, 0.12) | .21 |
| LCIA to LCIV | −0.38 (−0.52, −0.24) | <.001 | −0.03 (−0.07, 0.02) | .23 | 0.03 (−0.04, 0.10) | .41 |
| RCIA to RCIV | −0.42 (−0.60, −0.24) | <.001 | −0.07 (−0.12, −0.02) | .01 | −0.07 (−0.15, 0.01) | .09 |
| AO to sum of RCIA and LCIA | 0.44 (0.24, 0.64) | <.001 | 0.22 (0.19, 0.26) | <.001 | 0.17 (0.12, 0.22) | <.001 |
| IVC to sum of RCIV and LCIV | −0.10 (−0.25, 0.06) | .22 | 0.05 (0.002, 0.10) | .04 | 0.08 (0.03, 0.14) | .005 |

In the table, data in parentheses are 95% Cis. Listed P values correspond to t tests. AO=aorta, IVC=inferior vena cava, LCIA=left common iliac artery, LCIV=left common iliac vein, RCIA=right common iliac artery, and RCIV=right common iliac vein.

Manual and automated correction methods also demonstrated a reduction in variance of volumetric flow differences, with overall mean difference as follows: −0.14 L/min (95% limits of agreement: −1.61, 1.32) for uncorrected data, 0.05 L/min (95% limits of agreement: −0.32, 0.42) for manually corrected data, and 0.05 L/min (95% limits of agreement: −0.38, 0.49) for automatically corrected data, as shown in FIG. 10C. The Bartlett test of homogeneity of variances yielded an overall P<0.001, and pairwise F tests with Bonferroni correction demonstrated no significant difference between manual and automated correction (P<0.001 for manually corrected vs uncorrected data, P<0.001 for automatically corrected vs uncorrected data, P=0.10 for manual vs automatically corrected data).

Analysis of interobserver variability demonstrated excellent reliability both before and after background phase error correction. The intraclass correlation coefficient prior to correction was 0.94 (P<0.001). Manual and automated correction methods each improved the coefficient to 0.99 (P<0.001 for both).

The inventive approach obviates human, manual correction of magnetic phase error, the process of which is prone to error. Correction of background phase offset poses a challenge to the clinical application of four-dimensional (4D) flow MRI but can be accomplished using a single multichannel three-dimensional U-Net. Performance of manual correction requires substantial time and expertise due to the need for manual vessel segmentation. Previous studies have explored the effect of various parameters on the accuracy of image-based phase error correction, including the signal-to-noise ratio of the data itself, the percentage of stationary tissue used in the regression, and the spatial order of the regressed correction. In general, the quality of the correction decreases with decreasing percentage of static tissue, which means that manual tissue segmentation requires a delicate balance between excluding as many vessels as possible and maximizing inclusion of soft tissue. This deterioration is increasingly pronounced with regressions of higher spatial order; in fact, third- and sometimes second-order polynomial regressions are frequently rendered impossible due to insufficient soft-tissue selection. CNNs are able to overcome this limitation because they learn relevant features of input images on their own.

While the examples and embodiments described herein are directed to abdominal imaging, it will be apparent to those of skill in the art based on the teachings herein that similar results can be obtained for other body territories, scanners, vendors, by retraining the CNN using new 4D flow data sets or by using transfer learning to expand the generalizability of this CNN. The inventive methods provide a novel and reliable strategy for training a convolutional neural network (CNN) to learn and estimate a 3D magnetic phase error map from 4D flow MRI data. Using this strategy, the CNN does not require input from a human operator or any algorithm to identify static soft tissue. The corrected velocity data can then be smoothed with a polynomial fit to full correct magnetic phase error while avoiding spurious inaccuracies in the CNN inference. The inventive approach has been shown to improve measurement of blood flow with increased consistency and conservation of mass, comparable to what can be achieved with manual phase error correction.

REFERENCES (INCORPORATED HEREIN BY REFERENCE)

1. Dyverfeldt, P., Bissell, M., Barker, A. J. et al. 4D flow cardiovascular magnetic resonance consensus statement. J Cardiovasc Magn Reson 17, 72(2015). doi: 10.1186/s12968-015-0174-5
2. Hope M D, Sedlic T, Dyverfeldt P. Cardiothoracic magnetic resonance flow imaging. J Thorac Imaging. 2013 July; 28(4):217-30. doi:10.1097/RTI.0b013e31829192a1.

3. Pereira V M, Delattre B, Brina O, Bouillot P, Vargas M I. 4D Flow MRI in Neuroradiology: Techniques and Applications. Top Magn Reson Imaging. 2016 April; 25(2):81-7. doi: 10.1097/RMR.0000000000000082.
4. Callaghan F M, Burkhardt B, Geiger J, Valsangiacomo Buechel E R, Kellenberger C J. Flow quantification dependency on background phase correction techniques in 4D-flow MRI. Magn Reson Med. 2020 June; 83(6): 2264-2275. doi: 10.1002/mrm.28085.
5. Busch J, Giese D, Kozerke S. Image-based background phase error correction in 4D flow MRI revisited. J Magn Reson Imaging. 2017 November; 46(5):1516-1525. doi: 10.1002/jmri.25668.
6. Viola F, Dyverfeldt P, Carlhäll C J, Ebbers T. Data Quality and Optimal Background Correction Order of Respiratory-Gated k-Space Segmented Spoiled Gradient Echo (SGRE) and Echo Planar Imaging (EPI)-Based 4D Flow MRI. J Magn Reson Imaging. 2020 March; 51(3):885-896. doi: 10.1002/jmri.26879.
7. Roldán-Alzate A, Francois C J, Wieben O, Reeder S B. Emerging Applications of Abdominal 4D Flow MRI. AJR Am J Roentgenol. 2016 July; 207(1):58-66. doi: 10.2214/AJR.15.15995.
8. Cheng J Y, Zhang T, Ruangwattanapaisarn N, et al. Free-Breathing Pediatric MRI with Nonrigid Motion Correction and Acceleration. J Magn Reson Imaging JMRI. 2015; 42(2):407. doi: 10.1002/jmri.24785.
9. Cheng J Y, Hanneman K, Zhang T, et al. Comprehensive Motion-Compensated Highly-Accelerated 4D Flow MRI with Ferumoxytol Enhancement for Pediatric Congenital Heart Disease. J Magn Reson Imaging JMRI. 2016; 43(6):1355-1368. doi: 10.1002/jmri.25106.
10. Winkelmann S, Schaeffter T, Koehler T, Eggers H, Doessel O. An Optimal Radial Profile Order Based on the Golden Ratio for Time-Resolved MRI. IEEE Trans Med Imaging. 2007; 26(1):68-76. doi: 10.1109/TMI.2006.885337.
11. Cheng J Y, Alley M T, Cunningham C H, Vasanawala S S, Pauly J M, Lustig M. Non-rigid Motion Correction in 3D Using Autofocusing with Localized Linear Translations. Magn Reson Med Off J Soc Magn Reson Med Soc Magn Reson Med. 2012; 68(6):1785-1797. doi: 10.1002/mrm.24189.
12. Ronneberger, Olaf & Fischer, Philipp & Brox, Thomas. (2015). U-Net: Convolutional Networks for Biomedical Image Segmentation. LNCS. 9351.234-241. Doi: 10.1007/978-3-319-24574-4_28.

The invention claimed is:

1. A method for automated correction of phase error in magnetic resonance imaging (MRI)-based flow evaluation, comprising:
receiving in a computer processor configured for executing a trained convolutional neural network (CNN) image data comprising flow velocity data in three directions and magnitude data collected from a region of interest over a scan period from magnetic resonance imaging instrumentation, wherein the region of interest includes static tissue and vessels;
processing the image data with the trained CNN to generate output channels comprising pixelwise inferred corrections corresponding to dimensions of the flow velocity data;
smoothing the pixelwise inferred corrections using a regression algorithm to generate smoothed corrections; and
adding the smoothed corrections to the image data to generate corrected flow data, wherein the corrected flow data is used for flow visualization and quantization.

2. The method of claim 1, wherein the trained CNN is trained using manually corrected data obtained via manual segmentation of the static tissue followed by a patch-wise linear regression of static tissue velocities.

3. The method of claim 2, wherein the trained CNN is trained over several hundred epochs using mean squared error loss, hyperbolic tangent activation, and Adam optimization.

4. The method of claim 1, wherein the trained CNN comprises a multichannel U-Net configured to process each dimension of phase-error correction.

5. The method of claim 1, wherein the regression algorithm comprises least squares regression to a third-order polynomial.

6. The method of claim 1, wherein the region of interest comprises an abdominal region of a subject and the vessels comprise abdominal vasculature.

7. A system for correction of phase error in magnetic-resonance imaging (MRI)-based flow evaluation, comprising:
at least one computer processor configured to:
acquire image data comprising flow velocity data in three directions and magnitude data collected from a region of interest over a scan period from magnetic resonance imaging instrumentation;
execute a convolutional neural network (CNN), wherein the CNN is trained to generate output channels comprising pixelwise inferred corrections corresponding to dimensions of the flow velocity data;
execute a smoothing algorithm on the pixelwise inferred corrections to generate smoothed corrections; and
add the smoothed corrections to the image data to generate corrected flow data, wherein the corrected flow data is used for flow visualization and quantization.

8. The system of claim 7, wherein the trained CNN is trained using corrected data obtained via manual segmentation of static tissue within the region of interest followed by extraction of static tissue velocities.

9. The system of claim 8, wherein the trained CNN is trained over several hundred epochs using mean squared error loss, hyperbolic tangent activation, and Adam optimization.

10. The system of claim 7, wherein the trained CNN comprises a U-Net having one or more channels associated with each velocity dimension.

11. The system of claim 7, wherein the smoothing algorithm comprises regression to a polynomial function.

12. The system of claim 7, wherein the region of interest comprises an abdominal region of a subject and includes vessels comprising abdominal vasculature.

13. A method for automated correction of phase error in magnetic resonance imaging (MRI)-based flow evaluation, comprising:
receiving in a computer processor configured for executing a trained convolutional neural network (CNN) image data comprising flow velocity data in three directions and magnitude data collected from a region of interest over a scan period from magnetic resonance imaging instrumentation, wherein the region of interest includes static tissue and vessels;

processing the image data with the trained CNN to generate one or more output channel comprising pixelwise inferred corrections for the flow velocity data in each velocity dimension;

smoothing the inferred corrections using a regression algorithm; and generating corrected flow data by adding the inferred corrections to the image data, wherein the corrected flow data is used for flow visualization and quantization.

14. The method of claim 13, wherein the regression algorithm comprises a regression to a polynomial function.

15. The method of claim 13, wherein the trained CNN comprises a U-Net having at least one channel configured to process each dimension of phase-error correction.

16. The method of claim 13, wherein the region of interest is one or more of a head, chest, abdomen, or pelvis of a subject.

17. The method of claim 13, wherein the region of interest comprises an abdominal region of a subject and the vessels comprise abdominal vasculature.

* * * * *